(12) United States Patent
Gremm

(10) Patent No.: US 6,518,820 B2
(45) Date of Patent: Feb. 11, 2003

(54) CIRCUIT ARRANGEMENT HAVING A CAPACITIVE SENSOR ELEMENT FOR A TOUCH CONTACT SWITCH

(75) Inventor: Oliver Gremm, Kuernbach (DE)

(73) Assignee: E.G.O. Elektro-Geraetebau GmbH (DE)

( * ) Notice: Subject to any disclaimer, the term of this patent is extended or adjusted under 35 U.S.C. 154(b) by 0 days.

(21) Appl. No.: 09/776,979

(22) Filed: Feb. 5, 2001

(65) Prior Publication Data

US 2001/0019228 A1 Sep. 6, 2001

(30) Foreign Application Priority Data

Feb. 5, 2000 (DE) .......................................... 100 05 173

(51) Int. Cl.$^7$ ............................................... H03K 17/60
(52) U.S. Cl. ...................................... 327/432; 327/432
(58) Field of Search .......................... 327/344, 108–112, 327/432

(56) References Cited

U.S. PATENT DOCUMENTS 5,214,372 A  *  5/1993  Vaisanen et al. ............. 327/100
5,231,358 A  *  7/1993  Kapsokavathis et al. ..... 324/672
5,270,710 A     12/1993  Gaultier et al.

FOREIGN PATENT DOCUMENTS

DE    27 33 791     2/1978
DE    197 06 167    8/1998

* cited by examiner

*Primary Examiner*—Kenneth B. Wells
(74) *Attorney, Agent, or Firm*—Akerman Senterfitt

(57) ABSTRACT

The invention in one embodiment provides a circuit arrangement for a sensor element of a contact switch, in which a high frequency control signal (13) is applied to the sensor element (15). The circuit arrangement (11) has a signal source (12) for the control signal (13), a transistor (T), to whose base (B) is applied across a pass filter (R1, C1) and a voltage divider (C1, 15) the control signal (13), a resistor (R2) applied to ground (18) ensuring a certain base current, the transistor collector (C), to which the output signal (17) is applied, is connected to ground across a capacitor (C2), whilst between the transistor base (B) and ground is located a capacitive sensor element (15). A preferred application field of the invention is a touch contact switch of a glass ceramic hotplate of an electric cooker.

11 Claims, 2 Drawing Sheets

CIRCUIT ARRANGEMENT HAVING A CAPACITIVE SENSOR ELEMENT FOR A TOUCH CONTACT SWITCH

FIELD OF APPLICATION AND PRIOR ART

The invention relates to a circuit arrangement for at least one sensor element of at least one touch contact switch, particularly operating on a capacitive basis. A control signal having a specific operating frequency is applied to the sensor element and is modified as a function of the operating state of the sensor element. The sensor element can e.g. be operated by the approach or application of a finger, which is intended to represent a switching signal. This switching signal is detected and evaluated by the circuit arrangement and is transmitted to further switching devices.

A circuit arrangement of this type is e.g. known from DE 19 706 167 or U.S. Pat. No. 5,270,710. The circuit arrangements are either relatively complicated or have inadequate operating characteristics.

OBJECT OF THE INVENTION

The object of the invention is to provide a circuit arrangement of the aforementioned type, which has a simple construction and can be constructed with a relatively small number of components used in a standard manner and which minimizes the influence of faults.

SUMMARY OF THE INVENTION

This problem is solved by a circuit arrangement having the features of claim 1. Advantageous developments of the invention form the subject matter of subclaims and are also explained hereinafter.

According to the invention the circuit arrangement has a signal source, which supplies the control signal, which is generally an alternating current signal. It also contains a transistor, to whose base is applied the control signal by means of a filter and/or a voltage divider. The filter is preferably constituted by a pass filter. By means of a resistor an at least minimum base current is produced at the transistor. The transistor collector is connected to earth or ground by means of a capacitor. The output signal of the circuit arrangement can be tapped at the transistor collector for further processing. Between the transistor base and ground is connected the sensor element, which is a capacitive sensor element. Apart from the filtering action, the filter can also be used for producing a signal shift.

A particularly preferred sensor element is e.g. described in U.S. Pat. No. 5,973,417 Goetz et. al, whose content is by express reference made into part of the content of the present description. It can be constructed in the manner of a unitary body from conductive foam. By the application of a finger of a user to this sensor element a capacitive coupling of the user to ground is produced and the sensor element, together with the user, can be seen as a capacitor connected to ground. The use of other sensor elements is obviously also possible.

The pass filter is advantageously a high-pass filter and can be constructed from a resistor and a capacitor.

The voltage divider can be of a capacitive nature. It is advantageously constructed in such a way that a capacitor of the voltage divider is a component of the aforementioned pass filter. Resistors can also form part of the voltage divider. This leads to a reduction in the number of components.

Preferably a resistor is provided and by means thereof at least the capacitor between the transistor collector and ground can be discharged. This discharge process occurs in a phase in which the control signal has a zero or lower potential. Advantageously also the capacitor of the capacitive voltage divider and/or a capacitor of the pass filter can be discharged, in particular also across said resistor.

The output signal which can be tapped at the transistor collector is supplied for further processing e.g. to a microcontroller, which determines whether an operation or a desired switching initiation has taken place. This can in particular be established by a disruption of the control voltage if during operation a further capacitor is connected to ground. Through the use of the present invention it is possible to obtain such a large signal swing of the circuit that an evaluation of the output signal can be carried out without an amplifier. In particularly preferred manner a unipolar square wave signal constitutes the control signal.

These and further features can be gathered from the claims, description and drawings and the individual features, either individually or in the form of subcombinations, can be implemented in an embodiment of the invention and in other fields and can represent advantageous, independently protectable constructions for which protection is hereby claimed. The subdivision of the application into individual sections and the subheadings in no way restrict the general validity of the statements made thereunder.

BRIEF DESCRIPTION OF THE DRAWINGS

Embodiments of the invention are described hereinafter relative to the attached drawings, wherein show.

DETAILED DESCRIPTION OF PREFERRED EMBODIMENTS

Figure 1:
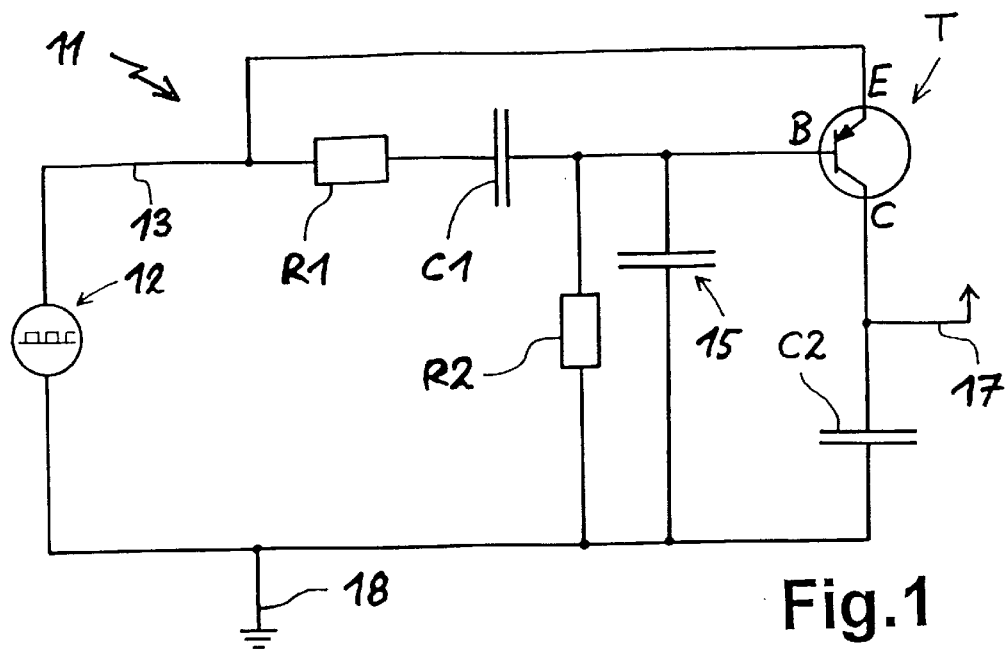
FIG. 1 A circuit arrangement for illustrating the invention.
Figure 2:
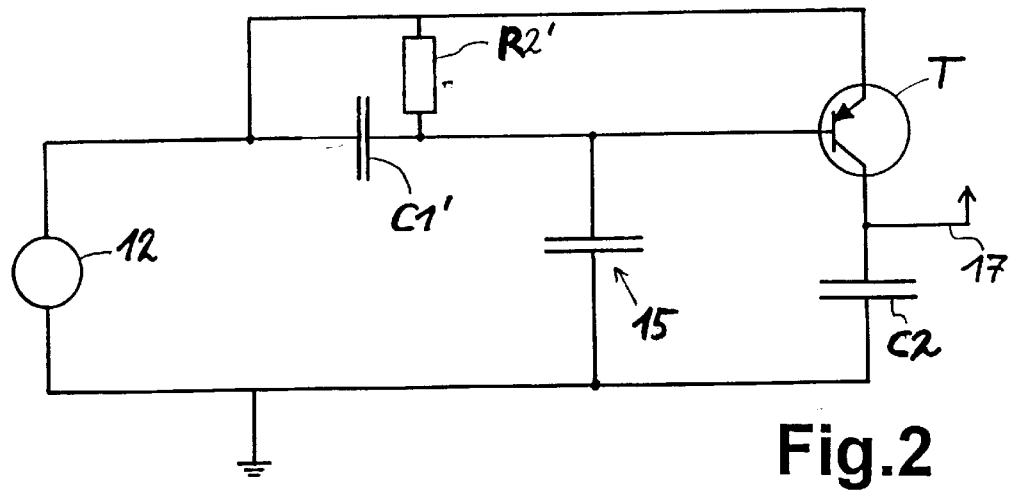
FIGS. 2 to 7 illustrate further embodiments of the invention, with each figure representing a different embodiment.
Figure 3:
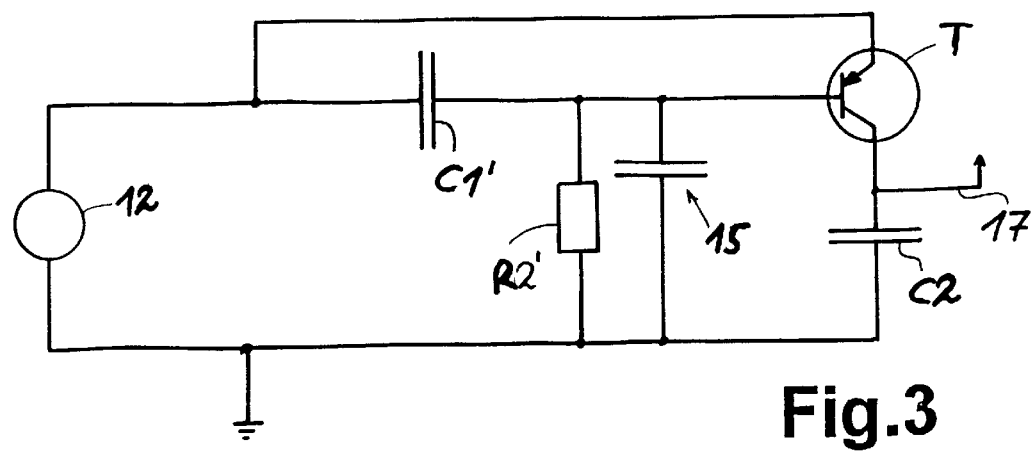
Figure 4:
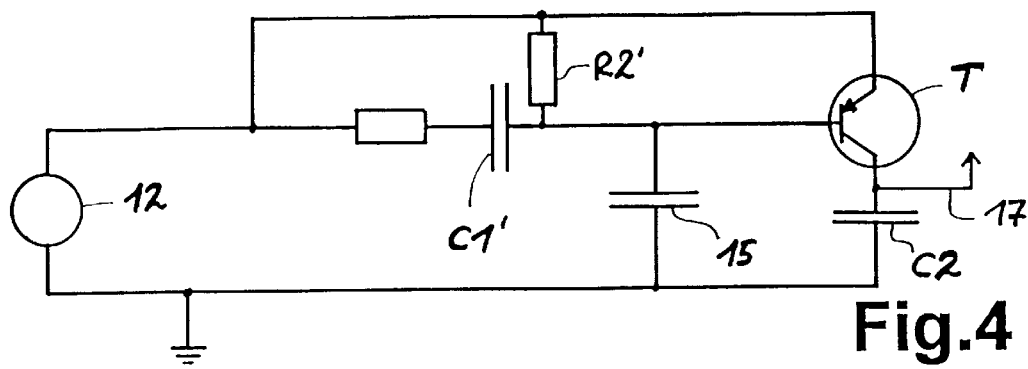
Figure 5:
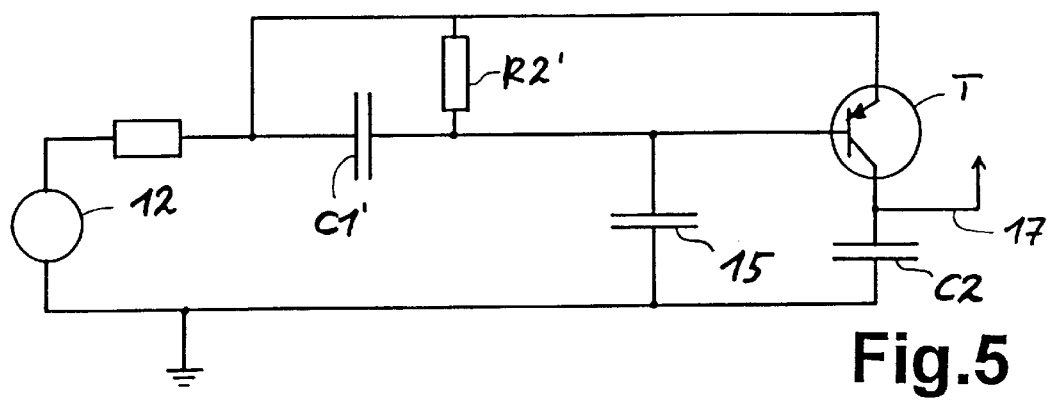
Figure 6:
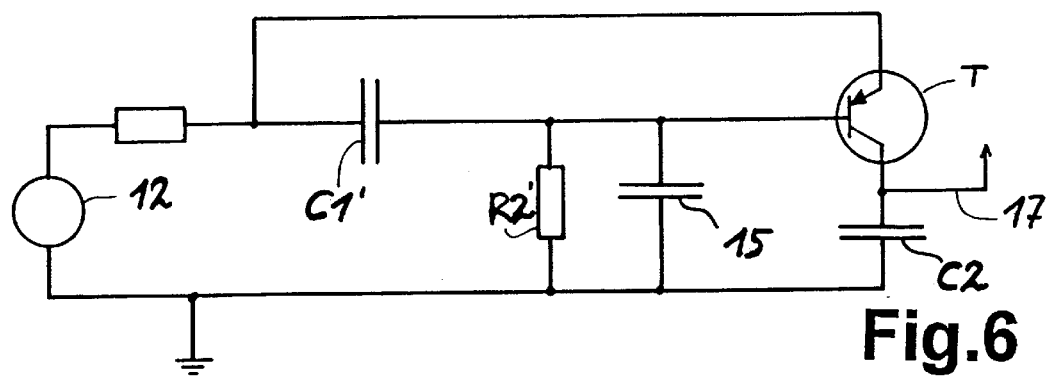
Figure 7:
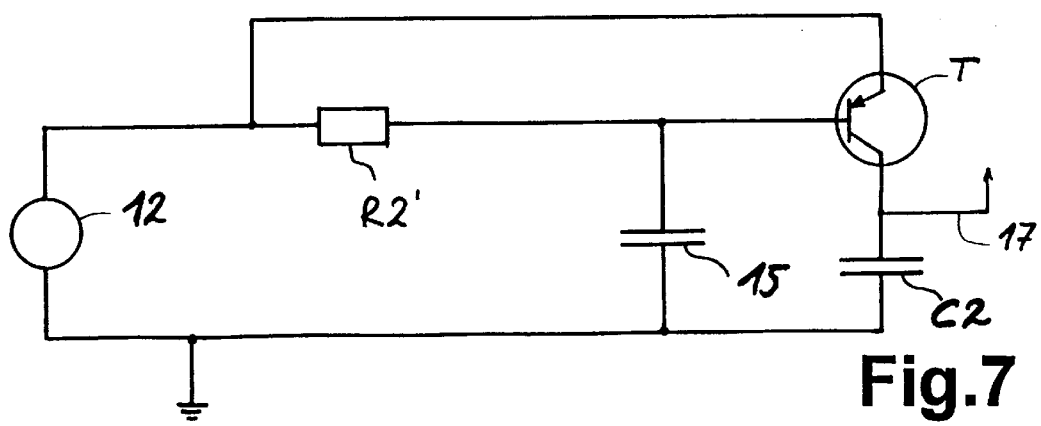

FIG. 1 shows an embodiment of a circuit arrangement 11 by means of which the basic components of the invention are illustrated and the operation can be explained. A control signal is produced or generated by a control signal source 12 and in the present case it is e.g. a unipolar square wave signal. The control signal 13 is directly supplied to the emitter E of a transistor T, here e.g. a PNP transistor of the Q2N2907A type.

The control signal 13 is also supplied across the resistor R1 and a capacitor C1 to the base B of transistor T. The resistor R1 and capacitor C1 form a pass filter for the control signal applied to the base. An exemplified dimensioning of the values for R1 and C1 is 470 kOhm and 47 pF.

The base B of the transistor T is applied across a resistor R2 to the ground connection 18. The resistor R2 permits a biasing of the transistor, so that at least a minimum base current can flow. An exemplified value for the resistor R2 can be 10 MOhm.

Additionally a sensor element 15 (shown in exemplified manner by the circuit symbol of a capacitor) is connected between the base B and ground connection 18.

Diverging from this circuitry representation in reality the sensor element 15 is essentially formed by a capacitor plate, which is generally applied to a dielectric or the like. If a user applies a finger to the dielectric facing said capacitor plate, said contact surface forms the second capacitor plate, which is connected to ground via the user. The capacitor C1 and sensor element 15 form a capacitive voltage divider, whose mutual relationship determines the strength of the control signal 13 to base B.

The collector C of transistor T is applied across a capacitor C2 to the ground connection 18. For C2 can e.g. be chosen a value of 22 nF. From the collector C there is a tap to a microcontroller or the like to which is applied the output signal 17. Said output signal 17 can be evaluated by the not shown microcontroller or some other following circuit arrangement.

Hereinafter a brief description is given of the operation of the circuit arrangement 11 according to FIG. 1.

The control signal 13, which in exemplified manner can be a unipolar square wave signal with a frequency of approximately 50 kHz, is supplied by means of the high-pass filter constituted by R1 and C1 to the base B of transistor T. In the unoperated state of the sensor element 15 it is not present in the circuit or the connection to the ground connection 18 is interrupted. However, if the sensor element 15 is operated, the circuit arrangement according to FIG. 1 exists and the sensor element 15 has become a capacitor applied to ground.

The high-pass filter is more particularly used for input fault suppression at the base. The capacitor C1 and sensor element 15 (as a capacitor) represent a capacitive voltage divider. As a function of their mutual size ratio the control signal to the base B is damped or reduced. As a result there is a further opening of the transistor T and the capacitor C2 at the collector is charged to a higher voltage value. This change can in turn be read from the output signal 17, which consequently also has a higher voltage value. At the end of the operation of the sensor element 15, the capacitor formed by it no longer exists and the damping and voltage value of the output signal 17 at the collector decreases, because there is an ever increasing closing of the transistor T.

Consequently the transistor operates in this circuit as a variable resistor controlled via its base. The resistor R2 is used for the discharge of the capacitors (C1, C2, sensor element 15) during the time when the control signal 13 is at 0 Volt or lower.

As a result of the circuit according to the invention, e.g. in accordance with FIG. 1, it is possible to achieve a particularly large signal swing thereof. This can be so large that it is possible to evaluate the output signal 17 without an amplifier. The output signal 17 at the collector C of the transistor T is in the form of a d.c. voltage. The HF behaviour of the circuit is greatly improved by the high-pass filter.

A use example for a circuit arrangement, with sensor element, according to the invention is a touch contact switch for controlling an electric cooker. The sensor element 15 can be installed under a glass ceramic hotplate of the electric cooker and can be operated from above by the application of a finger.

Further embodiments of a circuit arrangement are shown in FIGS. 2 to 7, which in each case constitute modifications of the circuit arrangement 11 of FIG. 1. The inventively essential features are in each case implemented and there is only a variation to the construction of the input filter and the voltage divider (capacitor or mixed capacitive-ohmic). It is consequently not considered necessary to discuss these circuits in detail. The operating principle of the circuit is in each case the same. The references R1' and C1' represent variations of the resistor for biasing the transistor and the capacitor for the capacitive voltage divider with the sensor element 15. Only the circuit arrangement according to FIG. 7 constitutes an exception in that here the voltage divider is in mixed ohmic-capacitive form, without a capacitor C1', the sensor element 15 here forming the capacitive part.

Obviously the circuit can be implemented in manners other than those shown.

What is claimed is:

1. A touch contact switch circuit arrangement having at least one sensor element, wherein a control signal with an operating frequency is applied to said sensor element and is variable according to the operating state of said sensor element, said sensor element being operated by the approach or application of a finger, comprising:

a signal source for producing said control signal, wherein said control signal is an alternating current signal;

at least one of a filter and a voltage divider;

a transistor, said control signal being applied across at least one of said filter and said voltage divider to a base of said transistor;

a resistor ensuring a minimum base current at said transistor; and a collector of said transistor applied across a capacitor to ground;

wherein an output signal at said transistor collector is tapped;

wherein said sensor element is connected between said transistor base and ground;

wherein said sensor element is a capacitive sensor element having a first capacitor plate applied to a dielectric material;

wherein a contact surface is formed by applying a finger of a user to the dielectric material;

wherein said contact surface forms a second capacitor plate; and whereby said second capacitor plate is connected to ground via the user.

2. Circuit arrangement according to claim 1, wherein said filter (R1, C1) is a high-pass filter comprising a resistor (R1) and a capacitor (C1).

3. Circuit arrangement according to claim 1, wherein said voltage divider (C1, 15) is capacitive.

4. Circuit arrangement according to claim 3, wherein a capacitor (C1) of said voltage divider (C1, 15) is a component of a high-pass filter comprising a resistor (R1) and said capacitor (C1).

5. Circuit arrangement according to claim 1, wherein said voltage divider is mixed ohmic-capacitive.

6. Circuit arrangement according to claim 5, wherein said sensor element forms the capacitive part of said voltage divider.

7. Circuit arrangement according to claim 1, wherein a resistor (R2) is provided by means of which said at least one capacitor (C2) is discharged at said transistor collector in a time span in which said control signal does not exceed 0 Volt.

8. Circuit arrangement according to claim 7, wherein the capacitor (15) of said capacitive voltage divider is discharged across said resistor (R2).

9. Circuit arrangement according to claim 7, wherein the capacitor (C1) of said pass filter is discharged across said resistor.

10. Circuit arrangement according to claim 1, wherein said output signal (17) is transmitted to a microcontroller for further processing.

11. Circuit arrangement according to claim 1, wherein said control signal (13) is a unipolar square wave signal.

* * * * *